(12) United States Patent
Mehrad et al.

(10) Patent No.: US 7,727,842 B2
(45) Date of Patent: Jun. 1, 2010

(54) METHOD OF SIMULTANEOUSLY SILICIDING A POLYSILICON GATE AND SOURCE/DRAIN OF A SEMICONDUCTOR DEVICE, AND RELATED DEVICE

(75) Inventors: Freidoon Mehrad, Plano, TX (US); Shaofeng Yu, Plano, TX (US); Steven A. Vitale, Murphy, TX (US); Joe G. Tran, Flower Mound, TX (US)

(73) Assignee: Texas Instruments Incorporated, Dallas, TX (US)

( * ) Notice: Subject to any disclaimer, the term of this patent is extended or adjusted under 35 U.S.C. 154(b) by 310 days.

(21) Appl. No.: 11/741,519

(22) Filed: Apr. 27, 2007

(65) Prior Publication Data
US 2008/0265344 A1    Oct. 30, 2008

(51) Int. Cl.
*H01L 21/8234* (2006.01)
(52) U.S. Cl. .................. 438/275; 438/692; 438/197
(58) Field of Classification Search ............... 438/275, 438/692, 197
See application file for complete search history.

(56) References Cited

U.S. PATENT DOCUMENTS

| 7,148,097 B2 * | 12/2006 | Yu et al. ................ 438/199 |
| 7,235,472 B2 * | 6/2007 | Klee et al. ............... 438/592 |
| 7,410,854 B2 * | 8/2008 | Yao et al. ................ 438/197 |
| 2005/0037580 A1 * | 2/2005 | Nakajima et al. ........ 438/275 |
| 2006/0105557 A1 * | 5/2006 | Klee et al. ............... 438/592 |

* cited by examiner

*Primary Examiner*—Thanh V Pham
*Assistant Examiner*—Caleb Henry
(74) *Attorney, Agent, or Firm*—Rose Alyssa Keagy; W. James Brady; Frederick J. Telecky, Jr.

(57) ABSTRACT

A method of simultaneously siliciding a polysilicon gate and source/drain of a semiconductor device, and related device. At least some of the illustrative embodiments are methods comprising forming a gate stack over a semiconductor substrate (the gate stack comprising a first polysilicon layer, a first nitride layer, and a second polysilicon layer), forming a second nitride layer over an active region in the semiconductor substrate adjacent to the gate stack, performing a chemical mechanical polishing that stops on the first nitride layer and on the second nitride layer, removing the first nitride layer and the second nitride layer, and performing a simultaneous silicidation of the first polysilicon layer and the active region.

20 Claims, 5 Drawing Sheets

METHOD OF SIMULTANEOUSLY SILICIDING A POLYSILICON GATE AND SOURCE/DRAIN OF A SEMICONDUCTOR DEVICE, AND RELATED DEVICE

BACKGROUND

Electronic devices are continually getting smaller, faster, and using less power, while simultaneously being able to support and perform a greater number of increasingly complex and sophisticated functions. One reason for these trends is an ever increasing demand for small, portable and multi-functional electronic devices. For example, cellular phones, personal computing devices, and personal audio devices (e.g., MP3 players) are in great demand in the consumer market. Such electronic devices rely on a limited power source (e.g., batteries) while providing ever-increasing processing capabilities and storage capacity.

Accordingly, there is a continuing trend in the semiconductor industry to manufacture low-cost, high-performance, and low-power integrated circuits (ICs). These goals have been achieved in great part by scaling down the dimensions of semiconductor ICs and thus increasing device and circuit densities. Achieving higher densities calls for smaller feature sizes, smaller separations between features and layers, and more precise feature shapes. The scaling down of IC dimensions can facilitate faster circuit performance (e.g., faster switching speeds) and can lead to higher effective yield in IC fabrication processes by providing (i.e., "packing") more circuits on a semiconductor die and/or more die on a semiconductor wafer.

Figure 1:
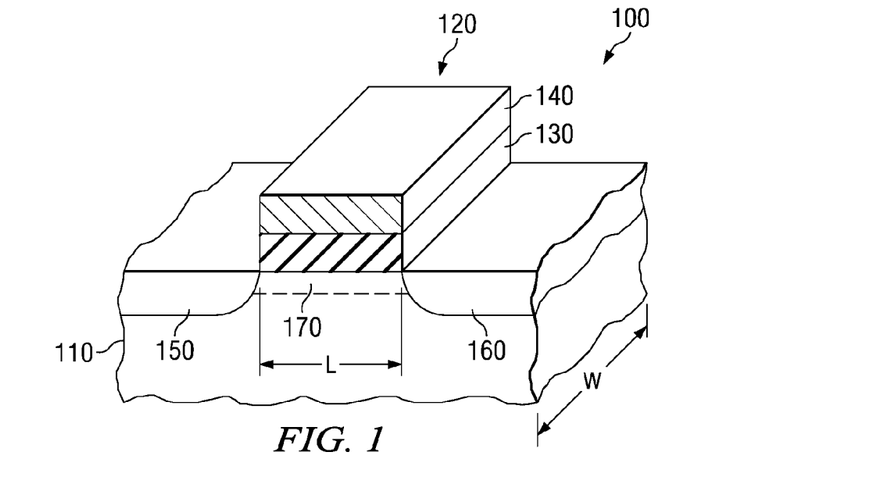
FIG. 1 shows a perspective view of a MOS transistor.

A fundamental building block of semiconductor ICs is the metal-oxide semiconductor (MOS) transistor. FIG. 1 illustrates a cross-section of a MOS transistor 100. The transistor 100 is fabricated on a semiconductor substrate 110 and comprises a gate stack 120. The gate stack 120 comprises a gate dielectric 130 (e.g., silicon dioxide) and a gate electrode 140 (e.g., polysilicon) on the gate dielectric 130. The transistor 100 also comprises a source region 150 and a drain region 160 each formed within the semiconductor substrate 110. A channel 170 is defined between the source and drain regions 150, 160, under the gate dielectric 130, and within the semiconductor substrate 110. The channel 170 has an associated channel length "L" and an associated channel width "W". When a bias voltage greater than a threshold voltage (Vt) (i.e., turn-on voltage) for the transistor 100 is applied to the gate electrode 140 along with a concurrently applied bias voltage between the source and drain regions 150, 160, an electric current (e.g., a transistor drive current) flows between the source and drain regions 150, 160 through the channel 170. The amount of drive current developed for a given bias voltage (e.g., applied to the gate electrode 140 or between the source and drain regions 150, 160) is a function of, among others, the width-to-length ratio (W/L) of the channel 170.

MOS transistors have become cheaper, faster, and less power-hungry with each new technology generation as the physical dimensions and applied voltages have been scaled down. To date, most transistor scaling has been achieved by thinning the gate dielectric 130 or reducing the channel length "L". However, as transistor scaling moves into the nanometer-scale regime, scaling the gate dielectric 130 thickness or the channel length "L" is not sufficient as new phenomenon appear (e.g., leakage current flowing through the gate dielectric 130, polysilicon gate electrode depletion effects ("poly-depletion"), and contact resistance effects), which reduce the transistor drive current. The poly-depletion effect is characterized by a polysilicon gate electrode 140 that is no longer fully conductive and contributes an additional capacitance (in series) between the gate electrode 140 and the silicon substrate 110, resulting in reduced transistor drive current. New gate dielectrics having a high dielectric constant ("high-K" gate dielectrics) have been introduced in an effort to improve transistor drive current without increasing the leakage current through the gate dielectric 130. However, high-K gate dielectrics face reliability and compatibility issues with polysilicon gate electrodes such as poor work function control, which results in, for example, transistors having an unsuitable threshold voltage (Vt). For other gate dielectric materials such as silicon dioxide, polysilicon gate electrodes become problematic with scaling due to the poly-depletion effect and contact resistance problems.

SUMMARY

The problems noted above are solved in large part by a method of simultaneously siliciding a polysilicon gate and source/drain of a semiconductor device, and related device. At least some of the illustrative embodiments are methods comprising forming a gate stack over a semiconductor substrate (the gate stack comprising a first polysilicon layer, a first nitride layer, and a second polysilicon layer), forming a second nitride layer over an active region in the semiconductor substrate adjacent to the gate stack, performing a chemical mechanical polishing that stops on the first nitride layer and on the second nitride layer, removing the first nitride layer and the second nitride layer, and performing a simultaneous silicidation of the first polysilicon layer and the active region.

Other illustrative embodiments are semiconductor devices comprising a substrate, a gate stack on the substrate (the gate stack comprising a first polysilicon layer, a first nitride layer, and a second polysilicon layer), a spacer along a sidewall of the gate stack, an active region within the substrate adjacent to the spacer, a second nitride layer on the active region (the second nitride layer is substantially aligned along a horizontal plane with the first nitride layer).

BRIEF DESCRIPTION OF THE DRAWINGS

For a more detailed description of the various embodiments, reference will now be made to the accompanying drawings, wherein.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

A "blocking" layer means a layer that substantially blocks, for example, blocks a dopant species delivered by way of ion implantation. Also, the term "active region" means a region where a semiconductor device is formed within and/or on a semiconductor substrate, and where the active region does not comprise isolation structures, such as shallow trench isolation (STI) structures or field oxide (FOX) regions.

Unless otherwise stated, when a layer is said to be "deposited over the substrate" or "formed over the substrate", it means that the layer is deposited or formed over any topography that already exists on the substrate.

The term "thermal budget" is used to define an amount of thermal energy transferred to a semiconductor wafer (e.g., during a high-temperature process) and is given as a product of temperature (e.g., in degrees Kelvin) and time (e.g., in seconds). Low thermal budget processes are preferred, for example, to prevent dopant redistribution or electromigration.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment. Also, layers and/or elements depicted herein are illustrated with particular dimensions and/or orientations relative to one another for purposes of simplicity and ease of understanding, and actual dimensions and/or orientations of the layers and/or elements may differ substantially from that illustrated herein.

The subject matter disclosed herein is directed to methods associated with construction of a semiconductor device, such as a metal-oxide semiconductor (MOS) transistor. A semiconductor is a material (e.g., silicon or germanium) having properties somewhere between a conductor and an insulator. By adding impurities (e.g., by a process known as "doping"), a semiconductor can be classified as being electron-rich (N-type, where "N" stands for Negative) or electron-poor (P-type, where "P" stands for Positive). Through a series of semiconductor processing techniques (e.g., deposition, photolithography, etching, ion implantation), semiconductor materials are used to make semiconductor devices (e.g., transistors) which are in turn used to make integrated circuits (ICs). Moreover, N-type MOS transistors (NMOS) and P-type MOS (PMOS) transistors are often used together to form complementary metal-oxide semiconductor (CMOS) ICs.

Metallic gate electrodes in semiconductor CMOS ICs overcome electrostatic and transport issues (e.g., poly-depletion, threshold voltage control, and contact resistance) associated with polysilicon gate electrodes. In particular, embodiments disclosed herein relate to integrating a metallic gate electrode into a CMOS process flow by way of a fully silicided (FUSI) process flow. Silicidation of a polysilicon gate electrode involves depositing a layer of metal (e.g., Nickel) over the polysilicon gate and annealing to induce a reaction between the metal and the polysilicon gate. During the anneal, a deposited layer of metal diffuses into the polysilicon gate and reacts to form a metal silicide (e.g., nickel silicide). In a FUSI process flow, the deposited layer of metal diffuses into, and reacts with, the entire polysilicon gate to form a "fully" silicided metal gate, as opposed to diffusing into, and reacting with, less than the entire polysilicon gate to form a partially silicided metal gate, where an unreacted polysilicon layer remains within the gate electrode. In other FUSI process flows, silicon from the polysilicon gate diffuses into the deposited metal layer as opposed to the metal diffusing into the polysilicon gate; however, the result is the same in that a fully silicided metal gate is formed. In some embodiments, a layer of metal is reacted with the source and drain regions of a transistor to form fully silicided source and drain regions, which lessens the contact resistance of the source and drain regions.

The metal layer used for silicidation has a thickness that is a function of the layer that is silicided (e.g., a polysilicon gate or a source/drain region). For example, a thick polysilicon gate (e.g., about 800-1000 Angstroms) can be fully silicided with a metal layer (e.g., Nickel) having a thickness of about 1000 Angstroms, and transistor source/drain regions can be fully silicided with a metal layer (e.g., Nickel) having a thickness of about 60-100 Angstroms. Moreover, if a thick metal layer (e.g., 800-1000 Angstroms of Nickel) is used to silicide transistor source/drain regions, metal of the thick metal layer can diffuse through the transistor (e.g., under sidewall spacers and under the transistor gate dielectric) and cause unwanted transistor operation (e.g., a short circuit between the transistor source and drain). Thus, silicidation of the polysilicon gate and of the source/drain regions can be performed at different stages of the process flow. However, performing the silicidation of the polysilicon gate and of the source/drain regions at different stages of the process flow adds undesirable complexity. Therefore, it is desirable to fully silicide the polysilicon gate and the source/drain regions simultaneously, while maintaining integrity of the transistor operation (i.e., avoiding diffusion (of the metal used for silicidation) through the transistor). Thus, the embodiments described herein provide a method of fully siliciding a polysilicon gate and source/drain regions simultaneously.

Also, prior to silicidation, the polysilicon gate may be doped with a dopant species (e.g., boron for PMOS transistors, and phosphorous or arsenic for NMOS transistors). Dopants can be introduced into the polysilicon gate to adjust the polysilicon gate work function. A transistor (e.g., an NMOS transistor) having a polysilicon gate doped with boron and/or phosphorous may, after silicidation, have an undesirable work function value since the work function value can change as a result of the silicidation process. Therefore, it is desirable to dope the polysilicon gate of a transistor (e.g., an NMOS transistor) with an alternative dopant (e.g., antimony) that will have a proper work function value after the silicidation process. Thus, some embodiments as described herein provide a method of doping a polysilicon gate prior to silicidation.

Figure 2:
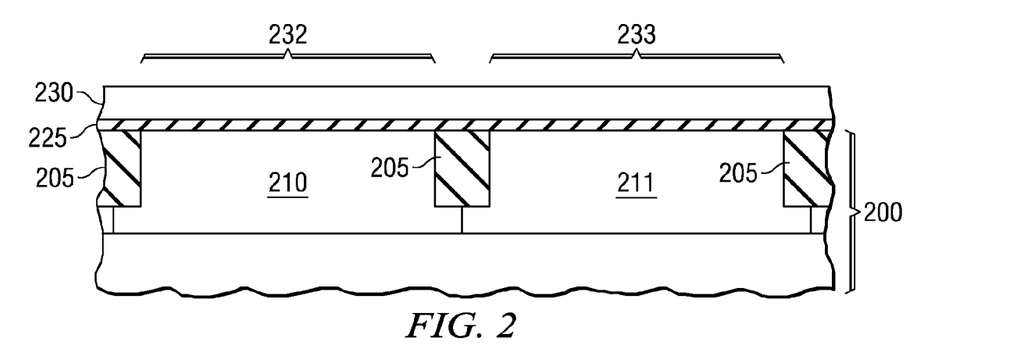
FIG. 2 shows a cross sectional view illustrating the formation of a MOS transistor after formation of a first polysilicon layer.

Referring to FIG. 2, isolation structures 205 are formed within a substrate 200 in order to define an active area 232 and an active area 233, and to electrically isolate neighboring devices (e.g., transistors) from one another. In some embodiments, the substrate 200 comprises, for example, a P-type single crystal silicon substrate that may be formed, for example, by epitaxial growth. In other embodiments, the substrate 200 comprises for example, a silicon germanium (SiGe) substrate or a silicon-on-insulator (SOI) substrate. The isolation structures 205 can be formed, for example, by a shallow trench isolation (STI) process. A well 210 and a well 211 are then formed within the substrate 200, for example, by performing an ion implantation into the substrate 200 followed by a high-temperature anneal. Each of the wells 210, 211 are doped with N-type dopants (e.g., phosphorous or arsenic) or P-type dopants (e.g., boron) depending on the type of transistor (NMOS or PMOS) to be formed within each of the active areas 232, 233. For purposes of this disclosure, the well 210 is doped with a P-type dopant (thus, an NMOS transistor is formed within the active area 232, and the active area 232 may be equivalently referred to as an NMOS active area 232), and the well 211 is doped with an N-type dopant (thus, a PMOS transistor is formed within the active area 233, and the active area 233 may be equivalently referred to as a PMOS active area 233). A dielectric layer 225 is then formed over the substrate 200. The dielectric layer 225 comprises a non-conductive material (e.g., a silicon oxide (i.e., $SiO_2$), a silicon oxynitride, or a high dielectric constant ("high-K") material such as a hafnium-based metal-oxide or a hafnium-based silicate). Depending on the material used for the dielectric layer 225, the dielectric layer 225 can be formed by a variety of techniques (e.g., thermal oxidation, thermal oxidation followed by a thermal nitridation, atomic layer deposition (ALD), or chemical vapor deposition (CVD)). A polysilicon layer 230 is then formed over the dielectric layer 225. The polysilicon layer 230 is formed, for example, by using a low-pressure chemical vapor deposition (LPCVD) process. In some embodiments, the polysilicon layer 230 has a thickness of about 150 Angstroms. The polysilicon layer 230 is used as the polysilicon gate for each of the NMOS transistor (formed in the NMOS active area 232) and the PMOS transistor (formed in the PMOS active area 233).

Figure 3:
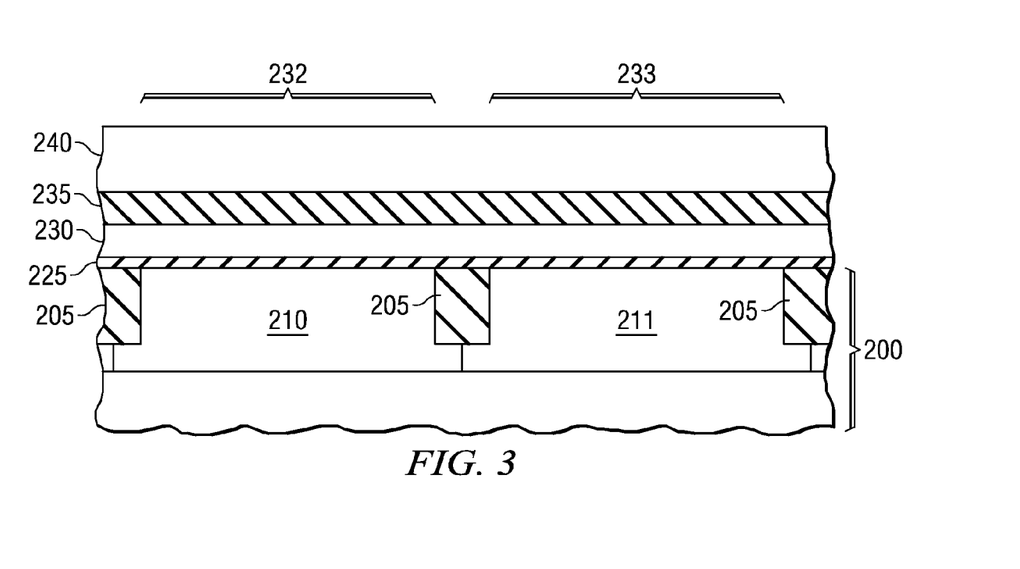
FIG. 3 shows a cross sectional view illustrating the formation of a MOS transistor after formation of a first nitride layer.
Figure 4:
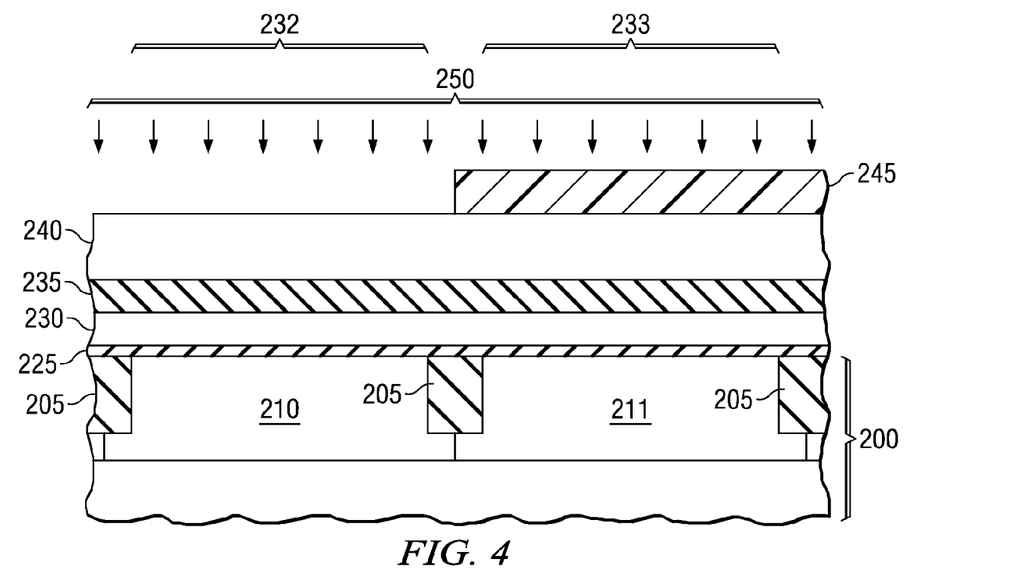
FIG. 4 shows a cross sectional view illustrating the formation of a MOS transistor during ion implantation through a second polysilicon layer and into the first polysilicon layer.
Figure 5:
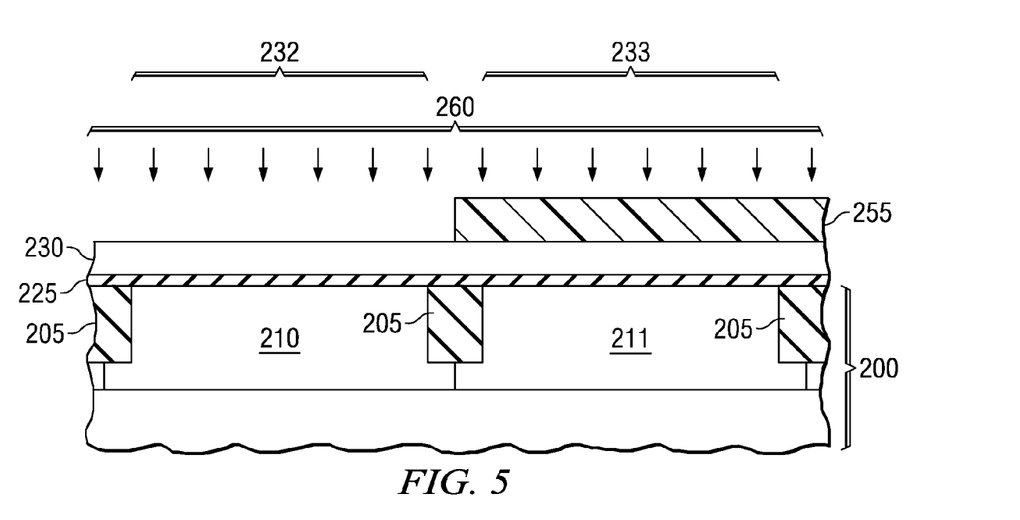
FIG. 5 shows a cross sectional view illustrating the formation of a MOS transistor during ion implantation into the first polysilicon layer.
Figure 6:
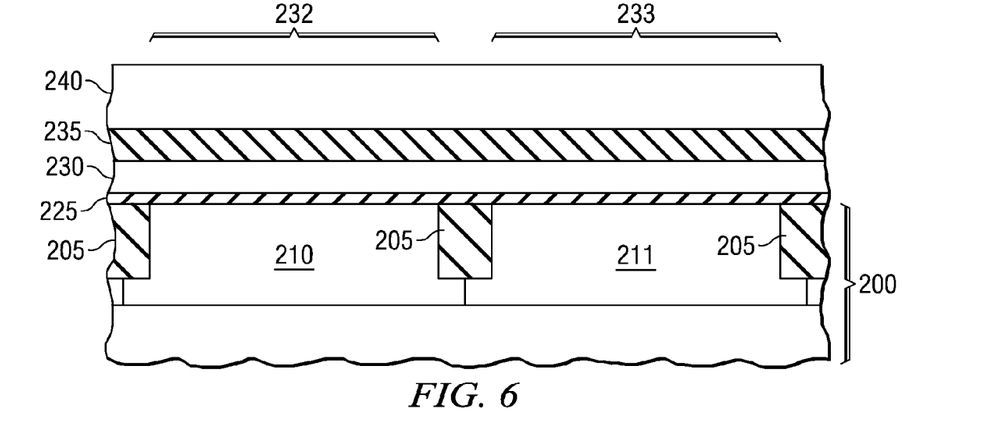
FIG. 6 shows a cross sectional view illustrating the formation of a MOS transistor after formation of the first nitride layer according to other embodiments.

After formation of the polysilicon layer 230, the polysilicon layer 230 is doped (e.g., by way of ion implantation). In some embodiments, the polysilicon layer 230 comprises an epitaxial layer of doped polysilicon (e.g., an epitaxial layer of antimony doped polysilicon). Depending on the type of transistor being formed (NMOS or PMOS), the polysilicon layer 230 is doped with either N-type or P-type dopants (e.g., N-type dopants in the NMOS active area 232 and P-type dopants in the PMOS active area 233). During the FUSI process flow (discussed below), the fully silicided gate electrode retains the doping of the polysilicon layer 230 so that the resulting fully silicided gate electrode has a work function and threshold voltage (Vt) determined, at least in part, by the doping. In some embodiments, the dopant species is selected in order to tune the work function of the gate electrode (e.g., antimony is used to dope the polysilicon layer 230 in the NMOS active area 232 to tune the work function of the NMOS gate electrode). The doping can be performed at various stages throughout the process flow. In some embodiments (e.g., as shown in FIGS. 3-4), the doping is performed after formation of additional layers (e.g., a nitride layer and a polysilicon layer) over the polysilicon layer 230. In other embodiments (e.g., as shown in FIGS. 5-6), the doping is performed before formation of additional layers (e.g., a nitride layer and a polysilicon layer) over the polysilicon layer 230. The doping process flow as illustrated in FIGS. 3-4 is now described, followed by a description of the doping process flow as illustrated in FIGS. 5-6.

Referring to FIG. 3, a nitride layer 235 is formed over the polysilicon layer 230. The nitride layer 235 is used as a landing pad for a chemical mechanical polishing (CMP) process and as a blocking layer that protects the polysilicon layer 230 from subsequent ion implantations (e.g., ion implantations used to form lightly-doped source/drain regions, or to form source/drain regions). The nitride layer 235 can be formed by various techniques (e.g., LPCVD or plasma enhanced chemical vapor deposition (PECVD)). In some embodiments, the nitride layer 235 has a thickness of about 150 Angstroms. Thereafter, a polysilicon layer 240 is formed over the nitride layer 235. Like the polysilicon layer 230, the polysilicon layer 240 can be formed by using an LPCVD process. In some embodiments, the polysilicon layer 240 has a thickness of about 500 Angstroms.

As shown in FIG. 4, a light sensitive layer 245 (e.g., photoresist) is deposited on the polysilicon layer 240 (e.g., by spin-coating), patterned using a mask (e.g., an N-type mask), and developed. The light sensitive layer 245 is used as part of a patterning process (e.g., as part of a lithography process, where lithography broadly refers to processes for transferring one or more patterns between various media). In photolithography, a light sensitive layer (e.g., the light sensitive layer 245) is applied on another layer (e.g., the polysilicon layer 240). The light sensitive layer is then patterned by exposing it to one or more types of radiation or light which selectively pass through an intervening mask which comprises a pattern defined by various transparent and opaque regions. The light causes exposed or unexposed regions of the light sensitive layer to become more or less soluble, depending on the type of light sensitive layer used. A developer (i.e., an etchant) is then used to remove the more soluble areas, thereby transferring the mask pattern to the light sensitive layer. The patterned light sensitive layer can then serve as a mask for an underlying layer or layers, where portions of the underlying layer or layers not covered, and thus not protected, by the light sensitive layer can be etched, ion implanted, or otherwise processed.

Processing of the light sensitive layer 245 results in removal of the light sensitive layer 245 over the NMOS active area 232 (as shown in FIG. 4). Thereafter, an ion implantation 250 is performed (using a particular dose of an N-type dopant species). In some embodiments, the N-type dopant species comprises antimony. The ion implantation 250 is performed (at a particular implant energy) into the NMOS active area 232 (while the light sensitive layer 245 protects the PMOS active area 233 from the ion implantation 250) in order to dope the polysilicon layer 230 in the NMOS active area 232 (i.e., the NMOS transistor gate). In particular, the implant energy is selected such that the peak of the implanted dose of the N-type dopant species (e.g., antimony) will lie within the polysilicon layer 230. The light sensitive layer 245 is then removed (e.g., by an "ashing" process, where the light sensitive layer 245 is removed by exposure to an oxygen ambient at a high-temperature in the presence of radio frequency (RF) power). The polysilicon layer 230 in the PMOS active area 233 (i.e., the PMOS transistor gate) can optionally be doped in a similar manner to the polysilicon layer 230 in the NMOS active area 232. In particular, doping of the polysilicon layer 230 in the PMOS active area 233 is performed using another light sensitive layer, another mask (e.g., a P-type mask) and another dopant (e.g., P-type dopant species such as boron).

Referring now to the process flow illustrated in FIGS. 5-6, in these embodiments the doping is performed before formation of the nitride layer 235 (FIG. 3) and the polysilicon layer 240 (FIG. 3) over the polysilicon layer 230. As shown in FIG. 5, a light sensitive layer 255 (e.g., photoresist) is deposited on the polysilicon layer 230 (e.g., by spin-coating), patterned using a mask (e.g., an N-type mask), and developed. Processing of the light sensitive layer 255 results in removal of the light sensitive layer 255 over the NMOS active area 232 (as shown in FIG. 5). Thereafter, an ion implantation 260 is performed (using a particular dose of an N-type dopant species). In some embodiments, the N-type dopant species comprises antimony. The ion implantation 260 is performed (at a particular implant energy) into the NMOS active area 232 (while the light sensitive layer 255 protects the PMOS active area 233 from the ion implantation 260) in order to dope the polysilicon layer 230 in the NMOS active area 232 (i.e., the NMOS transistor gate). In particular, the implant energy is selected such that the peak of the implanted dose of the N-type dopant species (e.g., antimony) will lie within the polysilicon layer 230. The light sensitive layer 255 is then removed (e.g., by an "ashing" process). The polysilicon layer 230 in the PMOS active area 233 (i.e., the PMOS transistor gate) can optionally be doped in a similar manner to the polysilicon layer 230 in the NMOS active area 232. As shown in FIG. 6, after doping the polysilicon layer 230 (as shown in FIG. 5), a nitride layer 235 is formed over the polysilicon layer 230. In some embodiments, the nitride layer 235 has a thickness of about 150 Angstroms. Thereafter, a polysilicon layer 240 is formed over the nitride layer 235. In some embodiments, the polysilicon layer 240 has a thickness of about 500 Angstroms.

Figure 7:
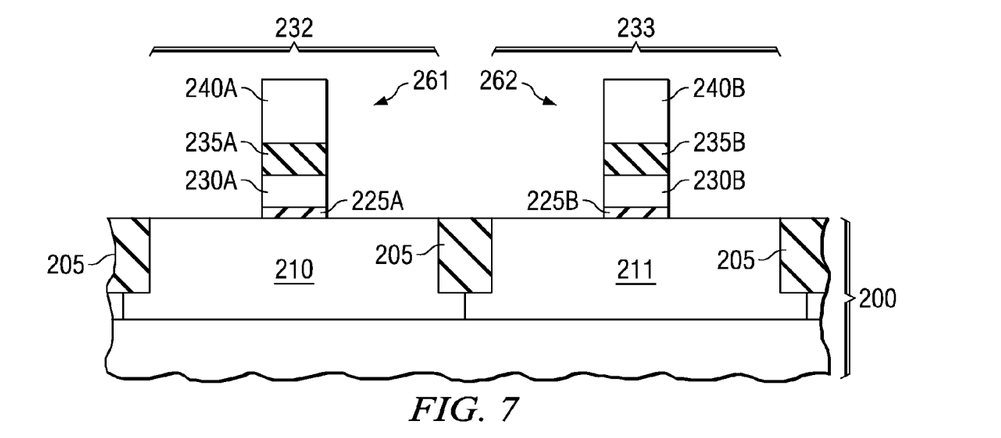
FIG. 7 shows a cross sectional view illustrating the formation of a MOS transistor after formation of an NMOS gate stack and a PMOS gate stack.

Regardless at which stage of the process flow the doping of the polysilicon layer 230 is performed, the resultant structures (as shown in FIG. 4 for a first doping process flow, and as shown in FIG. 6 for a second doping process flow) each comprise a dielectric layer 225, a doped polysilicon layer 230 (e.g., doped with antimony in the NMOS active area 232), a nitride layer 235 on the polysilicon layer 230, and a polysilicon layer 240 on the nitride layer 235. As shown in FIG. 7, the dielectric layer 225 (as shown in FIG. 4 and FIG. 6), the polysilicon layer 230 (as shown in FIG. 4 and FIG. 6), the nitride layer 235 (as shown in FIG. 4 and FIG. 6), and the polysilicon layer 240 (as shown in FIG. 4 and FIG. 6) have been patterned and etched to form an NMOS gate stack 261, where the NMOS gate stack 261 comprises a dielectric layer 225A, a polysilicon layer 230A, a nitride layer 235A, and a polysilicon layer 240A. The dielectric layer 225, the polysilicon layer 230, the oxide layer 235, and the polysilicon layer 240 are also patterned and etched to form a PMOS gate stack 262, where the PMOS gate stack 262 comprises a dielectric layer 225B, a polysilicon layer 230B, a nitride layer 235B, and a polysilicon layer 240B. For each of the NMOS gate stack 261 and the PMOS gate stack 262, the layers shown in FIG. 4 and FIG. 6 are patterned simultaneously by way of a light sensitive layer, and various (dry or wet) etchants can be used to remove each of the layers in sequence to form each of the NMOS gate stack 261 and the PMOS gate stack 262, using the patterned light sensitive layer as a mask. After etching of the layers to form the NMOS gate stack 261, the light sensitive layer, used for patterning of the layers of the NMOS gate stack 261, is removed (e.g., by an "ashing" process). Similarly, after etching of the layers to form the PMOS gate stack 262, the light sensitive layer, used for patterning of the layers of the PMOS gate stack 262, is removed (e.g., by an "ashing" process).

Figure 8:
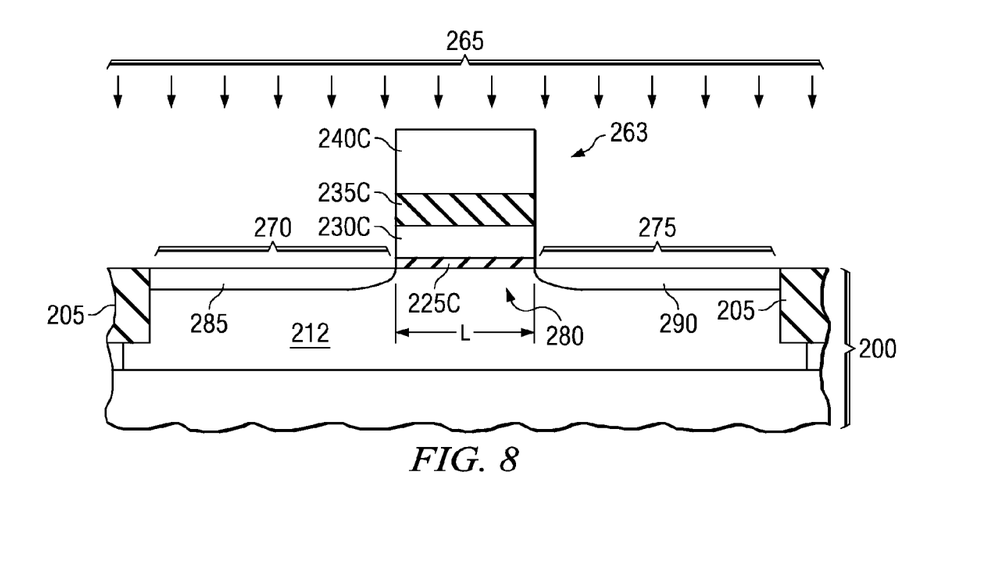
FIG. 8 shows a cross sectional view illustrating the formation of a MOS transistor after formation of source/drain extension regions.

The remainder of the process flow as described herein (shown in FIGS. 8-14) comprises, in part, fully siliciding a polysilicon gate and source/drain regions simultaneously, and the process flow (as shown in FIGS. 8-14) can be equivalently applied to an NMOS transistor formed in the NMOS active area 232 (FIG. 7) or to a PMOS transistor formed in the PMOS active area 233 (FIG. 7). Referring to FIG. 8, a gate stack 263 is, in some embodiments (e.g., when forming an NMOS transistor), the NMOS gate stack 261 (FIG. 7). In other embodiments (e.g., when forming a PMOS transistor), the gate stack 263 is the PMOS gate stack 262 (FIG. 7). Also, a well 212 can be doped with either a P-type dopant or an N-type dopant, depending on the type of transistor (NMOS or PMOS) that is being formed. Thus, the well 212 is, in some embodiments (e.g., when forming an NMOS transistor), the well 210 (FIG. 7). In other embodiments (e.g., when forming a PMOS transistor), the well 212 is the well 211 (FIG. 7). As shown in FIG. 8, the gate stack 263 comprises a dielectric layer 225C, a polysilicon layer 230C, a nitride layer 235C, and a polysilicon layer 240C. In some embodiments (e.g., when forming an NMOS transistor), the dielectric layer 225C is the dielectric layer 225A (FIG. 7), the polysilicon layer 230C is the polysilicon layer 230A (FIG. 7), the nitride layer 235C is the nitride layer 235A (FIG. 7), and the polysilicon layer 240C is the polysilicon layer 240A (FIG. 7). In other embodiments (e.g., when forming an PMOS transistor), the dielectric layer 225C is the dielectric layer 225B (FIG. 7), the polysilicon layer 230C is the polysilicon layer 230B (FIG. 7), the nitride layer 235C is the nitride layer 235B (FIG. 7), and the polysilicon layer 240C is the polysilicon layer 240B (FIG. 7).

After forming the gate stack 263 and after stripping the light sensitive layer used to pattern the gate stack 263, an ion implantation 265 is performed using a dopant species (e.g., an N-type dopant species when forming an NMOS transistor or a P-type dopant species when forming a PMOS transistor). The ion implantation 265 is performed into an active region 270 and into an active region 275 in order to define a lightly doped source region 285 and a lightly doped drain region 290. In some embodiments, the gate stack 263 is also simultaneously subjected to the ion implantation 265 such that the polysilicon layer 240C is doped by the ion implantation 265; however, the gate stack 263 masks the substrate 200 from the ion implantation 265, such that the lightly doped source and drain regions 285, 290 are formed within the substrate 200 immediately adjacent to the gate stack 263. Also, the nitride layer 235C serves as a blocking layer that protects the polysilicon layer 230C from the ion implantation 265. In some embodiments, a thin conformal oxide or nitride layer may be deposited over the gate stack 263 prior to the ion implantation 265 in order to protect sidewalls of the gate stack 263. The lightly doped source and drain regions 285, 290 may be equivalently referred to as source and drain extension regions. A channel 280 is defined between the lightly doped source region 285 and the lightly doped drain region 290, under the gate dielectric 225C, and within the substrate 200. The channel 280 has an associated channel length "L" and an associated channel width "W". In some embodiments, a thermal process, such as a rapid thermal anneal, is performed to activate the dopants within the lightly doped source and drain regions 285, 290, which may cause a slight lateral diffusion of the lightly doped source and drain regions 285, 290 under the gate stack 263.

Figure 9:
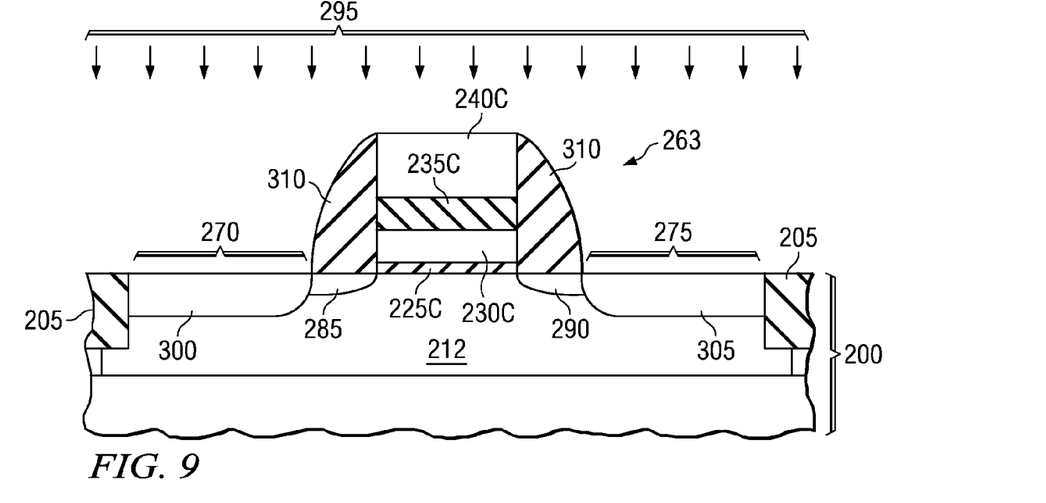
FIG. 9 shows a cross sectional view illustrating the formation of a MOS transistor after formation of source/drain regions.

Referring now to FIG. 9, a spacer 310 is formed on each sidewall of the gate stack 263. Each spacer 310 comprises an insulating material such as an oxide and/or nitride based material. In some embodiments, the spacers 310 comprise a bistertiary-butylaminosilane (BTBAS) silicon nitride layer. The spacers 310 are formed by depositing one or more layers of such material(s) over the substrate 200 in a conformal manner, followed by an anisotropic etch thereof, thereby removing spacer material from the top of the gate stack 263 and the substrate 200, while leaving the spacers 310 on each of the sidewalls of the gate stack 263. An ion implantation 295 is then performed. In particular, the ion implantation 295 is performed into the exposed portion of the active region 270 and into the exposed portion of the active region 275 in order to define a source region 300 and a drain region 305. In some embodiments, the gate stack 263 and spacers 310 are also simultaneously subjected to the ion implantation 295; however, the gate stack 263 and spacers 310 mask the substrate 200 from the ion implantation 295, such that the source and drain regions 300, 305 are formed within the substrate 200 immediately adjacent to the spacers 310. Also, the nitride layer 235C serves as a blocking layer that protects the polysilicon layer 230C from the ion implantation 295. In addition, the spacers 310 serve to protect the sidewalls of the gate stack 263. In some embodiments, a thermal process, such as a rapid thermal anneal, is performed to activate the dopants within the source and drain regions 300, 305, which may cause a slight lateral diffusion of the source and drain regions 300, 305 under the spacers 310.

Figure 10:
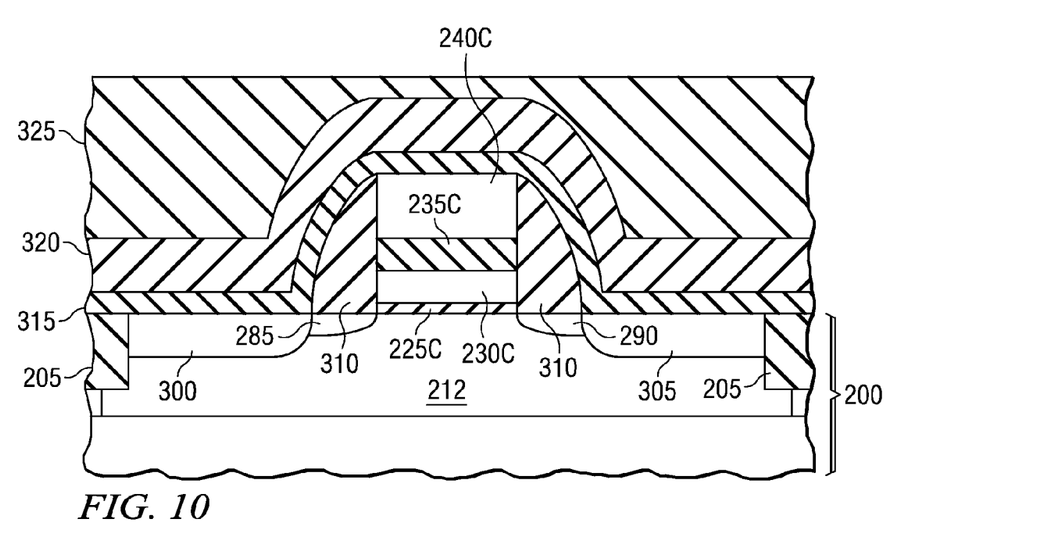
FIG. 10 shows a cross sectional view illustrating the formation of a MOS transistor after formation of a second nitride layer.

As shown in FIG. 10, once the source and drain regions 300, 305 have been formed, an oxide layer 315 is formed over the substrate 200 in a conformal manner. In some embodiments, the oxide layer 315 has a thickness of about 50 Angstroms. Thereafter, a nitride layer 320 is formed over the oxide layer 315 in a conformal manner. In some embodiments, the nitride layer 320 comprises a BTBAS silicon nitride layer and has a thickness of about 300 Angstroms. The oxide layer 315 prevents the formation of silicon dislocations within the substrate 200 which may form if the nitride layer 320 directly abuts the substrate 200. However, in some illustrative embodiments, the oxide layer 315 is not used (i.e., the nitride layer 320 is formed such that it directly abuts the substrate 200). Also, as shown in FIG. 10, portions of the nitride layer 320 that are formed over the active regions 270, 275 (FIG. 9) are substantially aligned along a horizontal plane with the nitride layer 235C. As such, the portions of the nitride layer 320 that are formed over the active regions 270, 275 (FIG. 9) and the nitride layer 235C are used as landing pads for a subsequent CMP process (i.e., as CMP stopping layers). In some embodiments, a distance between a horizontal plane defined by a top of the portions of the nitride layer 320 that are formed over the active regions 270, 275 (FIG. 9) and a horizontal plane defined by a top of the nitride layer 235C is less than about 50 Angstroms. In other embodiments, a distance between a horizontal plane defined by a top of the portions of the nitride layer 320 that are formed over the active regions 270, 275 (FIG. 9) and a horizontal plane defined by a top of the nitride layer 235C is between about 10-50 Angstroms. An oxide layer 325 is then formed over the nitride layer 320. The oxide layer 325 may comprise, for example, a layer of tetraethyl orthosilicate (TEOS), where the oxide layer 325 is used, at least in part, to form a planarized layer over the substrate 200. In some embodiments, the oxide layer 325 has a thickness of about 2000 Angstroms. A planarization of the oxide layer 325 is performed by way of a CMP process, whereby the oxide layer 325 is mechanically polished by a polishing pad while a chemical slurry containing abrasives chemically reacts with the oxide layer 325 to increase the removal rate of the oxide layer 325. Planarization by way of a CMP process is used, for example, to bring an entire topography within a depth of field (DOF) of a given photolithography system.

Figure 11:
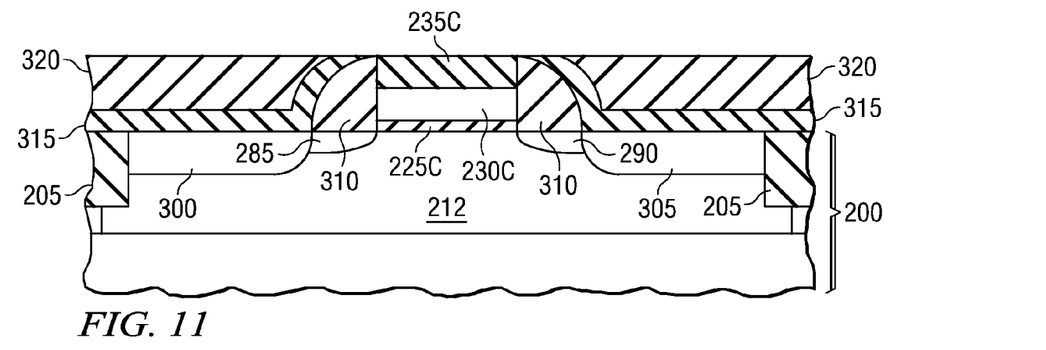
FIG. 11 shows a cross sectional view illustrating the formation of a MOS transistor after a chemical mechanical polishing (CMP) process.
Figure 12:
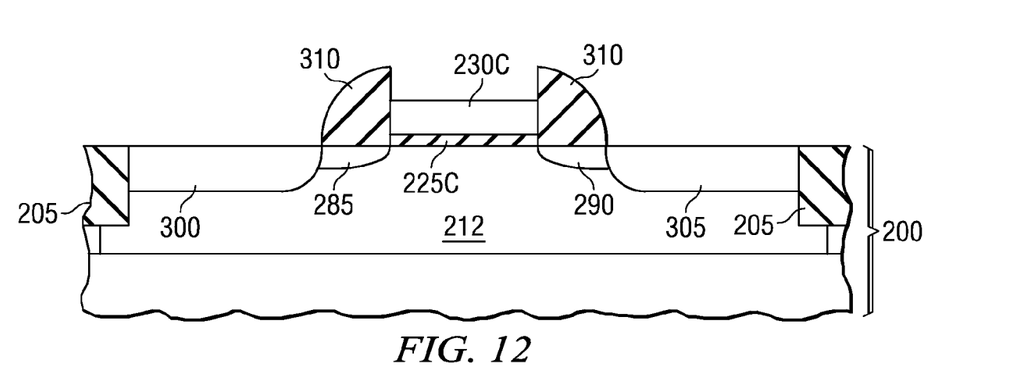
FIG. 12 shows a cross sectional view illustrating the formation of a MOS transistor after removal of the first nitride layer and the second nitride layer.

Referring to FIG. 11, the CMP process is performed until the nitride layer 235C and portions of the nitride layer 320 (formed over the active regions 270, 275 (FIG. 9)) are exposed. In particular, the nitride layer 235C and the portions of the nitride layer 320 (formed in the active regions 270, 275 (FIG. 9)) serve as landing pads for the CMP process (i.e., as CMP stopping layers). In some embodiments, portions of the nitride layer 320 (formed over the spacers 310) may also be exposed. After the CMP process, and as shown in FIG. 12, the nitride layer 320 (FIG. 11) and the nitride layer 235C (FIG. 11) are removed (e.g., by a wet deglaze process using hot phosphoric acid ($H_3PO_4$)). In addition, the oxide layer 315 (FIG. 11) is removed using an acid (e.g., hydrofluoric acid (HF)). The acid also etches (i.e., cleans) the top of the exposed polysilicon layer 230C and the top of the exposed source and drain regions 300, 305, so that the subsequent silicidation process will form high quality silicides.

Figure 13:
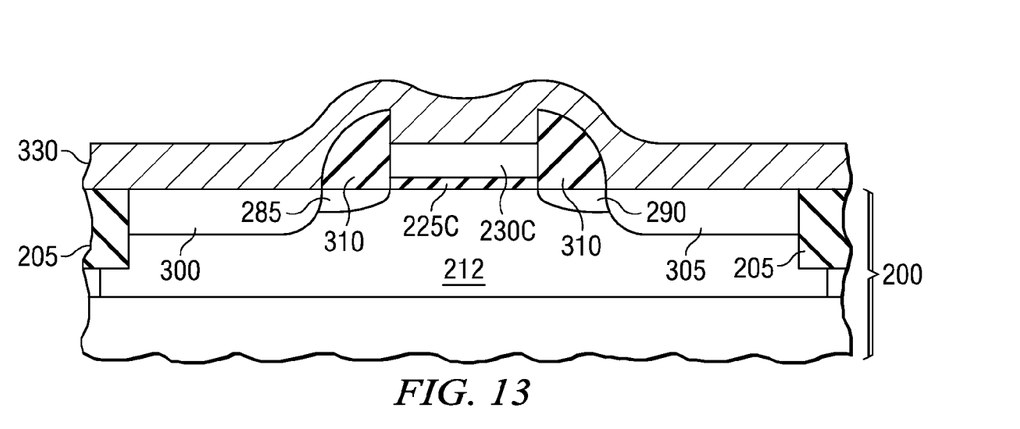
FIG. 13 shows a cross sectional view illustrating the formation of a MOS transistor after formation of a metal layer.

In FIG. 13, a metal layer 330 (e.g., nickel) is formed over the substrate 200 as a precursor to simultaneous silicidation of the polysilicon layer 230C and the source and drain regions 300, 305. In particular, since the polysilicon gate electrode (i.e., the polysilicon layer 230C) comprises a thin polysilicon layer (e.g., about 150 A), it is possible to use a thin metal layer (e.g., about 60-100 A) to perform the simultaneous silicidation, and the integrity of the transistor performance is maintained (i.e., diffusion of metal (used for silicidation) through the transistor is avoided). In some embodiments, the metal layer 330 is formed by a physical method, such as evaporation or sputtering. After formation of the metal layer 330, an anneal is performed to induce a reaction between the metal layer 330 and the polysilicon layer 230C, and between the metal layer 330 and the source and drain regions 300, 305. Thus, simultaneous silicidation of a polysilicon gate and source/drain regions is performed.

Figure 14:
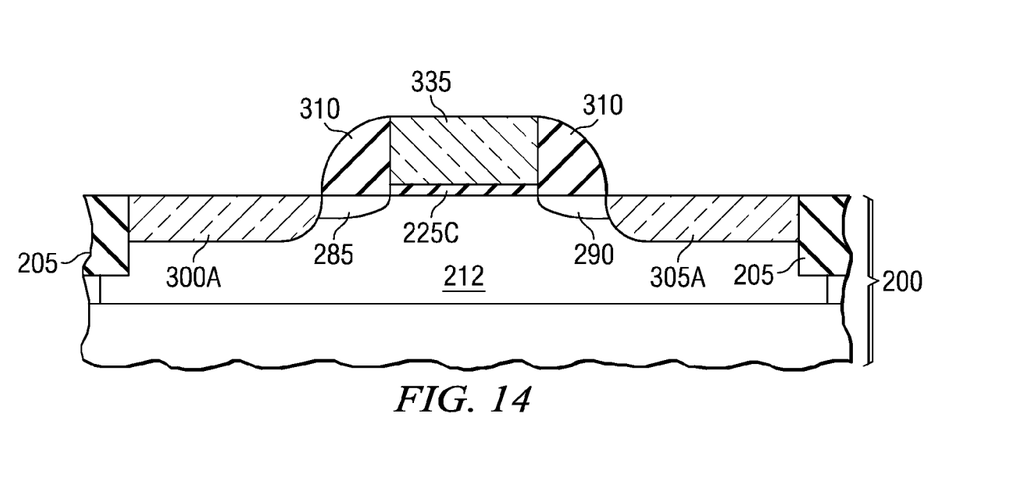
FIG. 14 shows a cross sectional view illustrating the formation of a MOS transistor after simultaneous silicidation of the first polysilicon layer and the source/drain regions.

As shown in FIG. 14, the reaction between the metal layer 330 (FIG. 13) and the polysilicon layer 230C (FIG. 13) creates a silicide layer 335 which serves as the transistor gate electrode. The reaction between the metal layer 330 (FIG. 13) and the source and drain regions 300, 305 (FIG. 13) creates a silicide layer 300A which serves as the transistor source region, and a silicide layer 305A which serves as the transistor drain region. In some embodiments, the silicide layers 335, 300A, 305A comprise nickel silicide (NiSi) layers. During the silicidation process, metal from the metal layer 330 reacts with the entire polysilicon layer 230C (FIG. 13) to form the fully silicided transistor gate electrode. Moreover, the doping introduced into the polysilicon layer 230C (e.g., antimony), either by way of the doping process as shown in FIGS. 3-4 or by way of the doping process as shown in FIGS. 5-6, is retained by the silicide layer 335 such that a desirable work function (e.g., of an NMOS gate electrode when antimony is used as the polysilicon layer 230C dopant) is achieved. Unreacted metal is then removed, for example, by way of a wet chemical etch. The thermal budget used to induce the reaction between the metal layer 330 (FIG. 13) and the polysilicon layer 230C (FIG. 13), and the source and drain regions 300, 305 (FIG. 13) is low as compared to, for example, the thermal budget used for activation of the source and drain regions 300, 305 (FIG. 13). Therefore, the silicidation process can be performed after higher thermal budget processing is complete. In some embodiments, after the silicide layers 335, 300A, 305A are formed, another anneal may be performed in order to change the phase of the silicide layers 335, 300A, 305A into a low-resistance phase. In yet other embodiments, the thermal budget used to induce the reaction between the metal layer 330 (FIG. 13) and the polysilicon layer 230C (FIG. 13), and between the metal layer 330 (FIG. 13) and the source and drain regions 300, 305 (FIG. 13) can be varied in order to form silicide layers 335, 300A, 305A having one of a plurality of phases, where the phase of the silicide layer determines, at least in part, the work function of the silicide layer. FIG. 14 also illustrates that there is a net volume expansion of the polysilicon layer 230C (FIG. 13) upon silicidation. In some embodiments, the top of the silicide layer 335 is substantially higher than the top of the spacers 310. In other embodiments, the top of the silicide layer 335 is substantially equal to the top of the spacers 310. In yet other embodiments, the top of the silicide layer 335 is substantially lower that the top of the spacers 310. After the simultaneous silicidation of the polysilicon gate and source/drain regions, other CMOS processing may follow (e.g., interlayer dielectric and metallization layers can be formed).

The above discussion is meant to be illustrative of the principles and various embodiments of the present invention. Numerous variations and modifications will become apparent to those skilled in the art once the above disclosure is fully appreciated. For example, unless otherwise indicated, any one or more of the layers set forth herein can be formed in any number of suitable ways (e.g., with spin-on techniques, sputtering techniques (e.g., magnetron and/or ion beam sputtering), thermal growth techniques, deposition techniques such as chemical vapor deposition (CVD), physical vapor deposition (PVD) and/or plasma enhanced chemical vapor deposition (PECVD), or atomic layer deposition (ALD)). Also, unless otherwise indicated, any one or more of the layers can be patterned in any suitable manner (e.g., via lithographic and/or etching techniques). It is intended that the following claims be interpreted to embrace all such variations and modifications.

What is claimed is:

1. A method comprising:
   forming a gate stack over a semiconductor substrate, the gate stack comprising a first polysilicon layer, a first nitride layer, and a second polysilicon layer;
   forming a second nitride layer over an active region in the semiconductor substrate adjacent to the gate stack;
   performing a chemical mechanical polishing that stops on the first nitride layer and on the second nitride layer;
   removing the first nitride layer and the second nitride layer; and
   performing a simultaneous silicidation of the first polysilicon layer and the active region.

2. The method according to claim 1 wherein forming the gate stack further comprises:
   forming a dielectric layer over the semiconductor substrate;
   forming the first polysilicon layer over the dielectric layer;
   forming the first nitride layer over the first polysilicon layer; and
   forming the second polysilicon layer over the first nitride layer.

3. The method according to claim 1 wherein performing the simultaneous silicidation comprises:
   forming a metal layer over the semiconductor substrate;
   annealing to induce a reaction between the first polysilicon layer and the metal layer, and between the active region and the metal layer; and then
   removing unreacted metal of the metal layer.

4. The method according to claim 2 further comprising, prior to forming the first nitride layer, performing an ion implantation into the first polysilicon layer.

5. The method according to claim 4 wherein performing the ion implantation further comprises implanting antimony.

6. The method according to claim 2 further comprising, after forming the second polysilicon layer, performing an ion implantation into the first polysilicon layer.

7. The method according to claim 6 wherein performing the ion implantation further comprises implanting antimony.

8. The method according to claim 2 wherein forming the first polysilicon layer further comprises growing an epitaxial layer of doped polysilicon.

9. The method according to claim 8 wherein growing the epitaxial layer of doped polysilicon further comprises growing an epitaxial layer of antimony doped polysilicon.

10. The method according to claim 1 further comprising:
    depositing a photosensitive layer over the semiconductor substrate; and
    patterning the photosensitive layer to expose an N-type region.

11. The method according to claim 1 further comprising forming a spacer along a sidewall of the gate stack.

12. The method according to claim 1 further comprising:
    forming an oxide layer over the semiconductor substrate; and
    forming the second nitride layer over the oxide layer.

13. The method according to claim 12 further comprising:
    deglazing the first nitride layer and the second nitride layer; and
    etching the oxide layer.

14. The method according to claim 1 wherein forming the gate stack further comprises forming the gate stack comprising a first polysilicon layer having a thickness of about 150 Angstroms.

15. The method according to claim 1 wherein forming the gate stack further comprises forming the gate stack comprising a first nitride layer having a thickness of about 150 Angstroms.

16. The method according to claim 1 wherein forming the gate stack further comprises forming the gate stack comprising a second polysilicon layer having a thickness of about 500 Angstroms.

17. The method according to claim 3 wherein forming the metal layer further comprises forming the metal layer having a thickness of about 60-100 Angstroms.

18. The method according to claim 12 wherein forming the oxide layer further comprises forming the oxide layer having a thickness of about 50 Angstroms.

19. The method according to claim 12 wherein forming the second nitride layer further comprises forming the second nitride layer having a thickness of about 300 Angstroms.

20. The method according to claim 1 further comprising performing an ion implantation into the active region, wherein the first nitride layer substantially blocks the ion implantation from the first polysilicon layer.

* * * * *